US011032953B2

(12) United States Patent
Harrigan

(10) Patent No.: US 11,032,953 B2
(45) Date of Patent: Jun. 8, 2021

(54) MUTUALLY SHIELDED PRINTED CIRCUIT BOARD ASSEMBLY

(71) Applicant: Microsoft Technology Licensing, LLC, Redmond, WA (US)

(72) Inventor: Jason Allen Harrigan, Sultan, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/394,996

(22) Filed: Apr. 25, 2019

(65) Prior Publication Data

US 2020/0344924 A1    Oct. 29, 2020

(51) Int. Cl.
| H05K 7/00 | (2006.01) |
| H05K 9/00 | (2006.01) |
| H05K 1/14 | (2006.01) |
| H05K 1/18 | (2006.01) |
| H05K 3/34 | (2006.01) |
| H05K 3/36 | (2006.01) |

(52) U.S. Cl.
CPC ........... *H05K 9/0024* (2013.01); *H05K 1/144* (2013.01); *H05K 1/181* (2013.01); *H05K 3/341* (2013.01); *H05K 3/3494* (2013.01); *H05K 3/368* (2013.01); *H05K 2201/042* (2013.01); *H05K 2201/1003* (2013.01); *H05K 2201/1006* (2013.01); *H05K 2201/10015* (2013.01); *H05K 2201/10022* (2013.01); *H05K 2201/10371* (2013.01); *H05K 2203/166* (2013.01)

(58) Field of Classification Search
USPC .......................................................... 361/760
See application file for complete search history.

(56) References Cited

U.S. PATENT DOCUMENTS 5,315,069 A    5/1994  Gebara
7,365,992 B2   4/2008  Lee
(Continued)

FOREIGN PATENT DOCUMENTS

| CN | 102892280 A | 1/2013 |
| EP | 2061289 A1 | 5/2009 |
| TW | 200930226 A | 7/2009 |

OTHER PUBLICATIONS

"International Search Report and Written Opinion Issued in PCT Application No. PCT/US20/025856", dated Jul. 27, 2020, 11 Pages.

*Primary Examiner* — Andargie M Aychillhum
(74) *Attorney, Agent, or Firm* — Alleman Hall Creasman & Tuttle LLP

(57) ABSTRACT

An electronic assembly includes a first printed circuit board (PCB), a second PCB, and a grounding shield. The first PCB includes a first plurality of electronic components and a first conductive layer. The second PCB includes a second plurality of electronic components and a second conductive layer. The grounding shield is electrically connected between the first conductive layer of the first PCB and the second conductive layer of the second PCB to electrically connect the first PCB and the second PCB. The first PCB and the second PCB are arranged in a stack such that the first conductive layer and the second conductive layer mutually shield at least one of the first plurality of electronic components and at least one of the second plurality of electronic components from electromagnetic interference.

20 Claims, 6 Drawing Sheets

(56) References Cited

U.S. PATENT DOCUMENTS

| | | |
|---|---|---|
| 7,952,889 B2 | 5/2011 | Chao |
| 8,817,489 B2 | 8/2014 | Yang |
| 2007/0222044 A1* | 9/2007 | Otremba ............... H01L 23/492 |
| | | 257/678 |
| 2008/0105963 A1* | 5/2008 | Carlson ............. H01L 23/49811 |
| | | 257/686 |
| 2012/0281378 A1 | 11/2012 | Chen |
| 2014/0048914 A1 | 2/2014 | Lin et al. |
| 2014/0055963 A1* | 2/2014 | Sawada ................ H05K 9/0007 |
| | | 361/749 |

* cited by examiner ns electronically connected between ground planes of two mutually shielding PCBs.

MUTUALLY SHIELDED PRINTED CIRCUIT BOARD ASSEMBLY

BACKGROUND

Electromagnetic (EM) radiation may be emitted from various electronic sources. Such EM radiation can prevent electronic devices from functioning properly due to electromagnetic interference (EMI). In order to protect against EMI, an EMI shield may be electrically connected to a printed circuit board (PCB) to block EM radiation. Sometimes one or more EMI shields may be required to cover the entire PCB or part of a PCB.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

An electronic assembly includes a first printed circuit board (PCB), a second PCB, and a grounding shield. The first PCB includes a first plurality of electronic components and a first conductive layer. The second PCB includes a second plurality of electronic components and a second conductive layer. The grounding shield is electrically connected between the first conductive layer of the first PCB and the second conductive layer of the second PCB to electrically connect the first PCB and the second PCB. The first PCB and the second PCB are arranged in a stack such that the first conductive layer and the second conductive layer mutually shield at least one of the first plurality of electronic components and at least one of the second plurality of electronic components from electromagnetic interference.

DETAILED DESCRIPTION

Figure 1A:
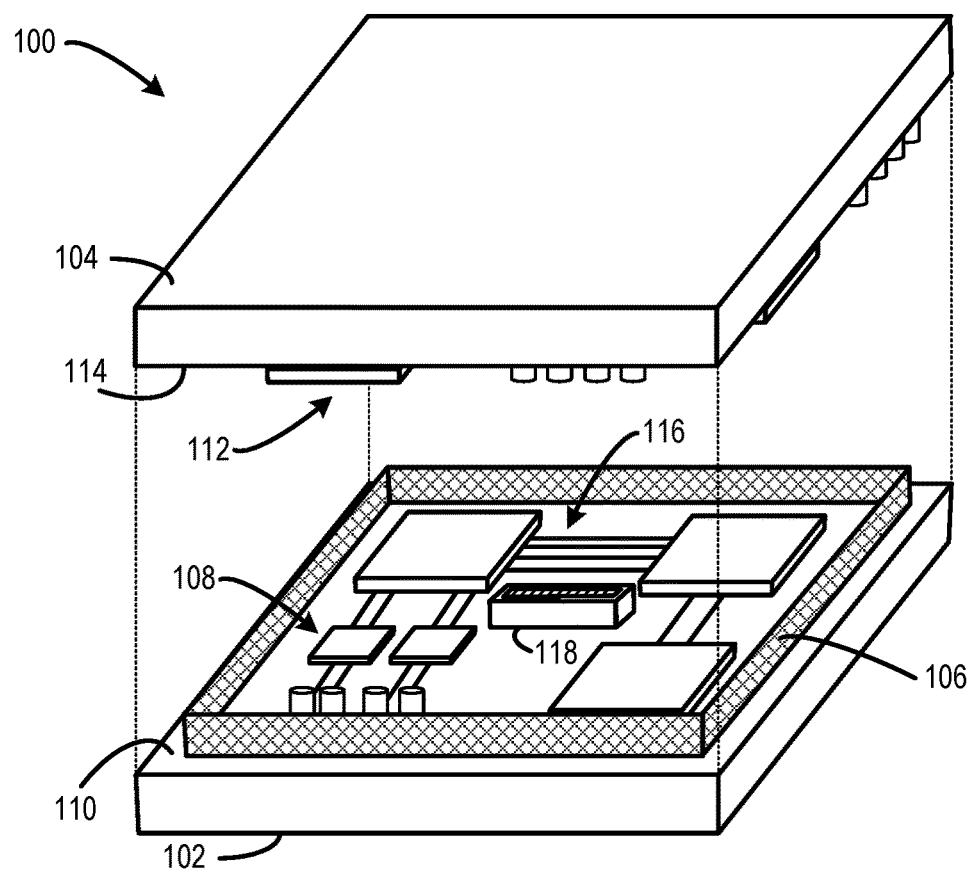
FIGS. 1A and 1B schematically show an example electronic assembly comprising mutually shielding printed circuit boards (PCBs) electrically connected to a common grounding shield.

Some electronic components mounted on a printed circuit board (PCB) may create signal noise that can electromagnetically interfere with other proximate radio components to degrade the performance of the radio components. This form of electromagnetic interference may be referred to as desensitization or "desense" where a radio receiver is unable to receive a radio signal that it might otherwise be able to receive when there is no interference. For example, desense of a radio component may be caused by a nearby electronic component with a noise signal having a similar frequency, which overloads the radio such that it is unable to fully receive the desired signal. Other scenarios may occur where sensitive electronic components on a PCB may be protected from noise produced from the environment or other locations on the device. In addition, a device may be required to comply with electromagnetic compatibility (EMC) regulations that stipulate the maximum and minimum noise a device can emit or can operate in the presence of, respectively. To mitigate the effects of desense and/or other electromagnetic interference, at least some electronic components on a PCB may be encapsulated by some form of electromagnetic interference (EMI) shield to electromagnetically isolate the electronic components. As one example, an EMI shield comprises a metal enclosure that surrounds electrical components on the PCB. The EMI shield may be electrically connected to a ground plane of the PCB to provide EMI shielding for the electronic components.

In electronic assemblies where two or more PCBs are used cooperatively, the two or more PCBs may be electrically connected to each other by one or more electrical connectors. In past solutions, each PCB would have a separate EMI shield or a plurality of EMI shields. The use of separate EMI shields for each PCB may cause an increase in the dimensions of the PCB, which in turn, may cause an increase in length of the electrical connector(s) electrically connected between the PCBs. In one example where the PCBs are arranged side-by-side, an electrical connector may have to extend beyond a perimeter formed by the EMI shield in order to reach the electronic components being shielded within the EMI shield (or another electrical connection point—e.g., ground plane, power plane). In this case, a distance between the edge of the PCB and the electronic components may be increased to allow for EMI shield to be positioned therebetween, which may contribute to an increase in length of the electrical connector. In another example where the PCBs are arranged in a stack, the EMI shields may have a height that is greater than a height of any of the electrical components on the PCBs. In this case, the height of the EMI shield may contribute to an increase in length of the electrical connector.

Furthermore, when making interconnections between two PCBs, various EMI issues may occur. High speed signals going through an interconnect typically are shielded either using a more complex and expensive connector or using a mechanical shield which encloses the interconnect. The number of interconnects that are used may be limited by cost or by EMI requirements. If lower cost connectors could be used without EMI issues, then multiple connectors could be used in multiple locations, which would reduce design constraints and/or cost. In addition, the length and placement of the electrical connector may limit the signal integrity and speed of signals that can travel between PCBs, as well as present PCB trace routing challenges. Attempting to add more electrical connectors to make trace routing easier may negatively impact EMI.

Accordingly, the present description is directed to an electronic assembly that addresses the above described issues. The electronic assembly may include a first PCB, a second PCB, and a grounding shield electrically connected between conductive layers (e.g., ground planes) of the first and second PCBs. The first PCB includes a first plurality of electronic components. The second PCB includes a second plurality of electronic components. The first PCB and the second PCB may be arranged in a stack such that a first conductive layer (e.g., ground plane) of the first PCB and a second conductive layer (e.g., ground plane) of the second PCB mutually shield at least one of the first plurality of electronic components and at least one of the second plurality of electronic components in cooperation with the grounding shield to provide isolation from an interior shielded region to the outside. Such isolation may include containing noise caused by the electronic components from leaving the interior shielded region, or may include preventing EMI from the environment from entering the interior shielded region.

In some examples, the grounding shield may surround an entirety of a perimeter of the two PCBs to provide perimeter EMI shielding to the first plurality of electronic components and the second plurality of electronic components. In some examples, the grounding shield may extend at least partially around one or more electronic components to provide EMI shielding for the one or more components. In some examples, the grounding shield may include a perimeter grounding shield as well as additional grounding shield elements inside of the perimeter to shield or isolate different electronic components.

Such an electronic assembly may improve upon the size and cost issues of the previous solutions described above. In particular, by replacing the two separate EMI shields with the mutual shielding provided by conductive layers of the two PCBs and the single common grounding shield, a distance (i.e., height) between the two PCBs may be reduced. This in turn may reduce the length of electrical connectors electrically connected between the two PCBs. Furthermore, in such an electronic assembly, electrical connectors may be electrically connected between the PCBs within an interior shielded region. This allows for the use of lower-cost, non-shielded electrical connectors. Additionally, the electrical connectors may be electrically connected between the PCBs at arbitrary positions within the interior shielded region. This allows for layout design flexibility that may increase integration density of the electronic components on the PCBs, which may reduce a footprint of the PCBs. Moreover, such design flexibility allows for the use of additional electrical connections between PCBs as desired, because lower cost unshielded electrical connectors may be used for such connections, and because not all traces/connections have to be fed through a single shielded electrical connector.

In some implementations, the grounding shield may comprise one or more surface-mountable electronic components or surface-mountable mechanical structures electrically connected between the first PCB and the second PCB. Such surface-mountable electronic components or surface-mountable mechanical structures may be configured to provide EMI shielding to at least some of the electronic components of the first and second PCBs. In some examples, such surface-mountable electronic components or surface-mountable mechanical structures may be commodity electronic components having a standardized size and shape that is configured to be installed on the PCBs in an automated fashion using commercially available machinery (e.g., a pick-and-place machine). By using such a production approach, the time and cost to produce such an electronic assembly may be reduced. Moreover, in some cases, the surface-mountable electronic components may provide additional benefits in addition to EMI shielding. In some examples, the surface-mountable electronic components may comprise decoupling, filtering, or matching components that may be electrically connected between electrically-conductive traces of the two PCBs. The decoupling, filtering, or matching components may be used to shunt or filter signals or noise, to filter or condition signals, or for impedance matching of signals sent via the electrically-conductive traces.

Figure 1B:
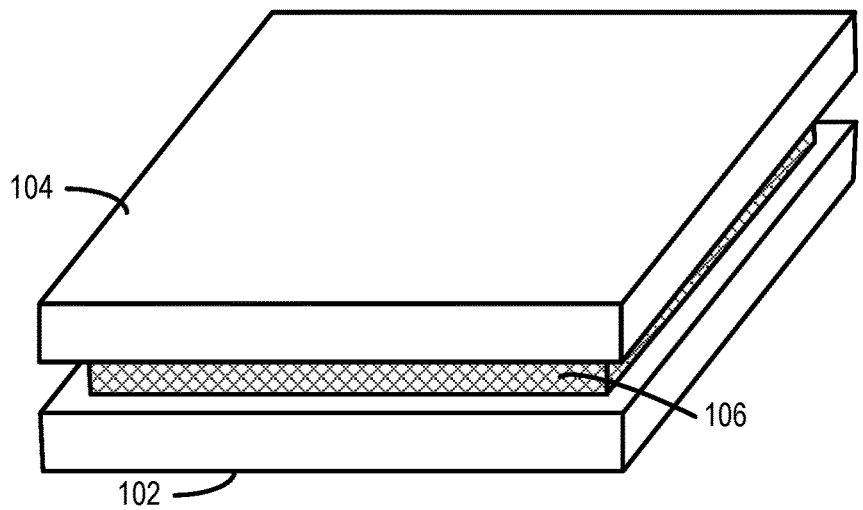

FIGS. 1A and 1B schematically show an example electronic assembly 100 comprising a first PCB 102 and a second PCB 104 electrically connected to a common grounding shield 106. FIG. 1A shows the second PCB 104 spaced apart from the first PCB 102 to reveal the grounding shield 106 and a first plurality of electronic components 108 positioned on a surface 110 of the first PCB 102. Further, a second plurality of electronic components 112 are positioned on a second surface 114 of the second PCB 104. The first and second PCBs 102 and 104 are arranged in a stack such that the surface 110 opposes the surface 114.

Any suitable type of electronic component may be mounted on the surfaces of the first PCB 102 or the second PCB 104. Non-limiting examples of electronic components that may be mounted on the surfaces of the first and second PCBs 102, 104 include passive circuit components (e.g., capacitors, resistors, inductors), active circuit components (e.g., diodes, transistors), electro-mechanical components, opto-electronic components, display components, audio components, sensor components, radio frequency (RF) components, integrated circuits (ICs), system on chip (SoCs), and electrical power components. In some examples, at least some of the plurality of electronic components 108 and/or 112 may be commodity surface-mountable or surface-mount technology (SMT) type components. In some examples, at least some of the plurality of electronic components 108 and/or 112 optionally may be through-hole type components.

A plurality of electrically-conductive traces 116 may extend along the surface 110 of the first PCB 102. The plurality of electrically-conductive traces 116 may be configured to electrically connect the plurality of electronic components 108 to various other electronic components and/or other circuitry (e.g., power, ground) on the first PCB 102. The plurality of electrically-conductive traces 116 may be formed of any suitable electrically-conductive material. As one example, the electrically-conductive traces 116 comprise copper. Any suitable number of electrically-conductive traces 116 may be laid out on the surface 110 of the first PCB 102 according to any suitable layout design. Further, in some examples, one or more of the electrically-conductive traces 116 may connect to different non-surface layers of the first PCB 102. Similarly, the second PCB 104 may include a plurality of electrically-conductive traces (not shown). In some examples, the electronic assembly may include electrical connectors that electrically connect between electrically-conductive traces on the first and second PCBs 102, 104.

A board-to-board interconnect 118 is mounted on the surface 110 of the first PCB 102. The interconnect 118 may be configured to electrically connect with a corresponding interconnect (not shown) on the second PCB 104 to enable signals to be sent between the two PCBs. The interconnect 118 may take any suitable form and may electrically and/or mechanically connect to the corresponding interconnect on the second PCB 104 in any suitable manner. As non-limiting examples, the interconnect may be snap fit, spring fit, or press fit with the corresponding interconnect to connect the two PCBs. In the depicted example, the interconnect 118 is positioned in the center of the first PCB 102. It will be appreciated that the interconnect may be placed at any suitable location on the first PCB 102. In some examples, two or more interconnect may be electrically connected between the two PCBs 102, 104.

The first and second PCBs 102, 104 may take any suitable form. More particularly, the first and second PCBs 102, 104 may be sized and shaped to accommodate the plurality of electronic components 108, 112 and the plurality of electrically-conductive traces 116. The first and second PCBs 102, 104 may include any suitable number of different layers including conductive layers (e.g., ground plane, power plane) and non-conductive/substrate layers (e.g., surface layers, insulating layers). In some examples, either of the first and second PCBs 102, 104 may be non-rigid or flexible.

FIG. 1B schematically shows the second PCB 104 electrically connected and mechanically affixed to the first PCB 102 via the grounding shield 106. The grounding shield 106 may be electrically connected between a first conductive layer of the first PCB 102 and a second conductive layer of the second PCB 104. The first and second PCBs 102, 104 may be arranged such that conductive layers—e.g., ground planes (not shown) of the first and second PCBs 102, 104 provide mutual shielding from EMI. In particular, a conductive layer in the first PCB 102 may provide a lower EMI shielding layer and a conductive layer in the second PCB 104 may provide an upper shielding layer. The lower shielding layer of the first PCB 102, the upper shielding layer of the second PCB 104, the surrounding grounding shield 106, and appropriate PCB vias collectively form an interior shielded region that electromagnetically isolates the electronic components 108, 112 and traces 116 positioned therein. The grounding shield 106 may serve multiple additional purposes, such as being a heat sink, chassis, or structural component providing mechanical support.

The electronic assembly optionally may include features that facilitate with heat dissipation of the electronic components. In some implementations, the grounding shield may be porous or may have holes to allow air to flow in the space between the PCBs. In some implementations, the electronic components 108 or 112 may be thermally connected to the opposite PCB through mechanical contact or a thermal interface material. The opposing PCB may have a plurality of vias or copper layers to spread or dissipate heat from the electronic components. In some implementations, a plurality of holes can be formed in the opposing PCB and a plurality of heat sinks can be directly attached to electronic components 108 or 112. In some implementations, holes can be formed in the PCBs to allow for airflow through the PCBs.

In some implementations, a thermal potting material may fill the space between the PCBs. In some implementations, the grounding shield may be a vapor chamber and may be configured to provide dual shielding and cooling functions.

In some examples, the ground planes may extend under substantially the entire surface of the PCBs 102, 104. In some examples, the first and second PCBs 102, 104 may include partial or non-continuous layers that occupy only a portion of the total area of the PCB. In some such examples, the first and second PCBs 102, 104 may provide mutual shielding in portions where both PCBs have overlapping ground planes.

In the depicted example, the grounding shield 106 runs continuously around the perimeter of the first and second PCBs 102, 104, to provide EMI shielding for all electronic components 108, 112 and electrically-conductive traces 116 on the surfaces the PCBs 102, 104. In some examples, the grounding shield 106 may surround only some of the electronic components 108, 112 and/or electrically-conductive traces 116 to form a shielded sub-region between the two conductive layers of the PCBs 102, 104. In some such examples, other electronic components not positioned within the shielded sub-region may be left partially shielded or unshielded. In some implementations, the grounding shield may include a perimeter grounding shield and additional interior grounding elements that at least partially surround individual electronic components or groups of electronic components to isolate the electronic component(s) from other electronic components within the interior shielded region. In other words, the grounding shield may comprise a plurality of different interior shielded regions that are isolated from one another to strategically prevent undesired resonances or coupling within the structure and/or to provide additional grounding in some areas.

The grounding shield 106 may comprise any suitable conductive material, such as metal, conductive foam, conductive fabric over foam, conductive elastomer, a metallic chassis or heat sink, surface mountable metallic structures, any other suitable conductor, or a combination thereof. A metal grounding shield may be fashioned in any suitable manner. For example, the metal grounding shield may be machined, stamped, or drawn. In some examples, the grounding shield 106 may comprise metal-plated plastic or resin. In some examples, the grounding shield 106 may comprise an aluminum chassis. The grounding shield 106 may be electrically connected and mechanically affixed to the first and second PCBs 102, 104 in any suitable manner. As one example, the grounding shield 106 may be electrically connected and mechanically affixed to the first and second PCBs 102, 104 via metal clips that are connected to the ground planes of each of the PCBs 102, 104. The metal clips may hold the grounding shield 106 in place via a tension fit or spring force fit. As another example, the grounding shield 106 may be electrically connected and mechanically affixed to the first and second PCBs 102, 104 via solder. As discussed in further detail below, in some implementations, different types of solder optionally may be used to connect different components for ease of construction of the electronic assembly 100.

In some examples, an electronic component on a PCB may be a source of EM radiation or coupling, and the interior shielded region may be configured to encapsulate the electronic component to contain the EM radiation or coupling at the source. In other examples, an electronic component on a PCB may be susceptible to EMI, and the interior shielded region may be configured to encapsulate the electronic component to block EM radiation or coupling from reaching the electronic component.

Note that the depicted electronic assembly only includes electronic components positioned on the interior surfaces of the PCBs. It will be appreciated that additional electronic components optionally may be positioned on exterior surfaces of the PCBs as well. In some of those examples, there may be an interior ground plane layer inside the PCB with via openings that allow some signals to pass between the exterior surface and the interior surface through the PCB. In some such examples, decoupling capacitors or other decoupling, filtering, or matching components may be placed on the PCB in these locations to shunt noise to the ground plane and keep it from escaping the shielded region. In some examples, decoupling, filtering, or matching components may not be used at such locations if the application does not require a high shielding effectiveness.

Figure 2A:
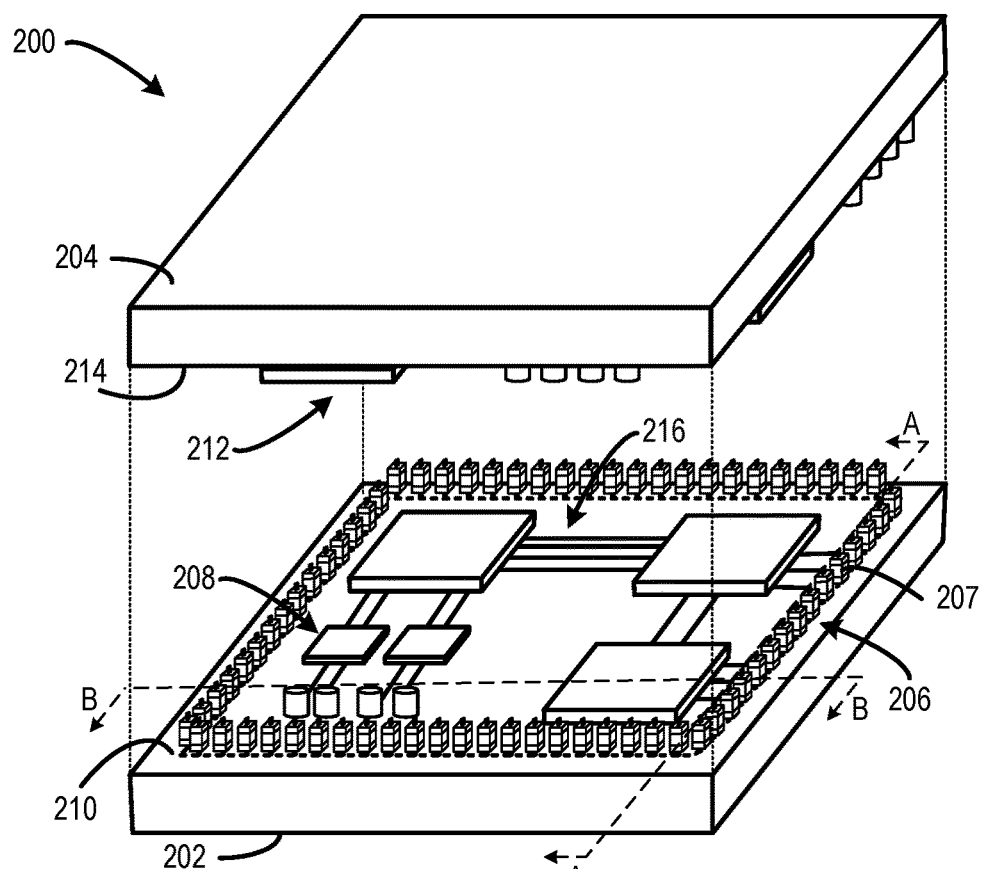
FIGS. 2A and 2B schematically show another example electronic assembly comprising mutually shielding PCBs electrically connected to a common grounding shield including a plurality of surface-mountable electronic components and/or surface-mountable metallic structures positioned around an entirety of a perimeter.
Figure 2B:
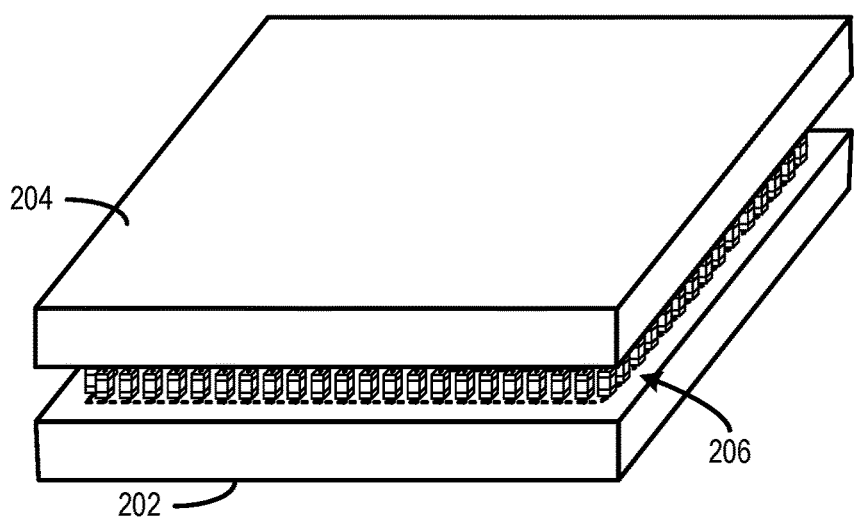

FIGS. 2A and 2B schematically show another example electronic assembly 200 comprising a first PCB 202 and a second PCB 204 electrically connected to a common grounding shield 206 comprising a plurality of commodity surface-mountable electronic components and/or surface-mountable metallic structures 207 around an entire perimeter of the of the PCBs 202, 204. FIG. 2A shows the second PCB 204 spaced apart from the first PCB 202 to reveal the grounding shield 206 and a first plurality of electronic components 208 positioned on a surface 210 of the first PCB 202. Further, a second plurality of electronic components 212 are positioned on a second surface 214 of the second PCB 204. A plurality of electrically-conductive traces 216 may extend along the surface 210 of the first PCB 202. The plurality of electrically-conductive traces 216 may be configured to electrically connect the plurality of electronic components 208 to various other electronic components and/or other circuitry (e.g., power, ground) on the first PCB 202. Similarly, the second PCB 204 may include a plurality of electrically-conductive traces (not shown). The first and second PCBs 202 and 204 are arranged in a stack such that the surface 210 opposes the surface 214.

FIG. 2B schematically shows the second PCB 204 electrically connected and mechanically affixed to the first PCB 202 via the plurality of commodity surface-mountable electronic components and/or surface-mountable metallic structures 207 of the grounding shield 206. The first and second PCBs 202, 204 may be arranged such that conductive layers—e.g., ground planes (not shown) of the first and second PCBs 202, 204 provide mutual shielding from EMI. Further, the first and second PCBs 202, 204 in cooperation with the plurality of commodity surface-mountable electronic components and/or surface-mountable metallic structures 207 that form the grounding shield 206 may collectively form an interior shielded region that electromagnetically isolates the electronic components 208, 212 and traces 216 positioned therein. The grounding shield 206 may serve multiple additional purposes, such as being a heat sink, chassis, or structural component providing mechanical support.

In some implementations, the grounding shield 206 may be used to dissipate heat using the individual surface-mountable electronic components and/or surface-mountable metallic structures 207. Heat may be dissipated via thermal conduction, convection, or radiation. A plurality of surface-mountable electronic components and/or surface-mountable metallic structures 207 may be added in the interior area between the PCBs to improve heat dissipation.

Each of the commodity surface-mountable electronic components and/or surface-mountable metallic structures 207 may provide an electrical connection between a first conductive layer of the first PCB 202 and a second conductive layer of the second PCB 204, such that the plurality of commodity surface-mountable electronic components and/or surface-mountable metallic structures 207 collectively form the grounding shield 206. In some examples, one or more of the commodity surface-mountable electronic component and/or surface-mountable metallic structures 207 may comprise a zero-ohm resistor that provides the electrical connection between the PCBs 202, 204. In some examples, the commodity surface-mountable electronic component and/or surface-mountable metallic structures 207 may comprise other electronic components as discussed in further detail herein.

Typically, a commodity surface-mountable electronic component is mounted to a single PCB. In such cases, the commodity surface-mountable electronic component is oriented "horizontally" with both ends electrically connected to different connection points on the same PCB. In contrast, each of the plurality of commodity surface-mountable electronic components and/or surface-mountable metallic structures 207 included in the grounding shield 206 are oriented "vertically" on end and connected between different PCBs.

The commodity surface-mountable electronic components and/or surface-mountable metallic structures 207 may have a standardized size and dimensions. Such commodity surface-mountable electronic components may be any suitable size and/or package type (e.g., 0402 or 0201). By using commodity surface-mountable components in this manner, the grounding shield 206 may have a substantially uniform height and thickness. Moreover, the electronic assembly 200 may be constructed using commercial manufacturing equipment, such as a pick-and-place machine, to electrically connect the commodity surface-mountable electronic components or surface-mountable metallic structures 207 to the PCBs. In other words, by using commercially available manufacturing equipment, production costs of the electronic assembly 200 may be reduced, since the electrical and mechanical characteristics of the component have already been designed, tested, and mass produced.

Note that commodity surface-mountable electronic components and/or surface-mountable metallic structures are one example of a type of electronic component that may be used to form the grounding shield 206, and other types of electronic components may be used in other examples. Further, other assembly approaches/technologies may be used to produce such an electronic assembly.

The commodity surface-mountable electronic components and/or surface-mountable metallic structures 207 may be electrically connected and/or mechanically affixed between the first PCB 302 and the second PCB 204 using any suitable conductive material/technology. In one example, the commodity surface-mountable electronic components and/or surface-mountable metallic structures 207 may be soldered between the first PCB 202 and the PCB 204. In one particular example, the commodity surface-mountable electronic components and/or surface-mountable metallic structures 207 may be first soldered to the first PCB 202 via a high-temperature solder. Then, the commodity surface-mountable electronic components and/or surface-mountable metallic structures 207 may be soldered to the second PCB 204 via a reflow solder having a lower melting point than the high-temperature solder. This may allow the entire first PCB 202 and the mounted commodity surface-mountable electronic components and/or surface-mountable metallic structures 207 forming the grounding shield 206 to be reflowed in an oven to solder it to the second PCB 204 without the high-temperature solder melting.

Additionally or alternatively, in some examples, the commodity surface-mountable electronic components and/or surface-mountable metallic structures 207 may be electrically connected and/or mechanically affixed in a different manner. Such examples may include epoxy, welding, friction or mechanical fit, spring force, and adhesive.

In some implementations, at least some of the commodity surface-mountable electronic components and/or surface-mountable metallic structures 207 that form the grounding shield 206 may be electrically connected to other conductors on either of the surfaces of the PCBs 202, 204 instead of the ground planes. As one example, a commodity surface-mountable electronic component and/or surface-mountable metallic structure may be electrically connected between power planes of the PCBs 202, 204. As one another example, a commodity surface-mountable electronic component and/or surface-mountable metallic structure may be electrically connected between electrically-conductive traces on the surfaces of the PCBs 202, 204. As yet another example, a commodity surface-mountable electronic component and/or surface-mountable metallic structure may be electrically connected between another conductor (e.g., any piece of copper) exposed on the surfaces of the PCBs 202, 204.

It should be noted that when a commodity surface-mountable electronic component and/or surface-mountable metallic structure is electrically connected between electrically-conductive traces on the surfaces of the PCBs 202, 204, it can act as a low-cost interconnect. This differs from existing implementations in important ways. First, the interconnect is very low-cost, for example, if using zero-ohm resistors the cost may be fractions of a penny. Second, it takes up very little PCB board space because it requires only a small footprint of a surface-mount component. Third, any radiated or coupled EM noise is contained between the PCBs and does not produce EMI extending outside of the PCBs to the extent of the shielding effectiveness of the mutual PCB shield. Fourth, because of the first three benefits, it allows a large number to be placed in potentially arbitrary locations on the PCB, which allows for more flexible routing options, potentially fewer PCB layers required and a lower-cost PCB, as well as enabling high density design such that more data can be passed from one PCB to the other and/or allowing more integrated circuits to be integrated closer together. These are all potential benefits over existing non-mutually shielded PCBs which are not connected together by commodity surface-mountable electronic components and/or surface-mountable metallic structures.

Active electronic components (e.g., transistors, ICs) 208, 212 on the first or second PCBs 202, 204 may operate at high frequencies or fast clock signals which can produce noise harmonics or a broadband noise spectrum. Under certain conditions, such as impedance mismatch, proximity, or geometric shape of conductors, electric and magnetic fields can radiate into space or couple to other electronic components. Furthermore, the electronic components 208, 212 may be connected to power supplies through electrically-conductive traces and/or other conductors with finite resistance and inductance. If current drawn by an active electronic component changes, voltage drops from power supply to device will also change due to these impedances. If several active devices share a common path to the power supply, changes in the current drawn by one element may produce voltage changes large enough to affect the operation of others—e.g., voltage spikes or ground bounce—so the change of state of one electronic component may be coupled to others electronic components in the form of signal noise through the common impedance to the power supply. In some cases, an electronic component may not be generating noise, but there is a need to optimize impedance matching to the electronic component so that signal losses can be minimized. In other cases, no noise may be present, but filtering or conditioning of a signal may be desired, such as a band pass filter, lowpass filter, or diplexer.

To address these issues, in some implementations, one or more of the commodity surface-mountable electronic components 207 may be a decoupling, filtering, or matching component. In some examples, the decoupling, filtering, or matching component may be electrically connected between the electrically-conductive traces on each of the PCBs 202, 204. The decoupling, filtering, or matching component connected between the electrically-conductive traces may help prevent radiation or coupling of electromagnetic interference due to component frequency content or rapidly changing power supply currents. In particular, the decoupling, filtering, or matching component may provide a bypass path for transient currents to flow through a return path instead of allowing the transient current to flow through the common impedance of the electrically-conductive traces. In this case, the decoupling, filtering, or matching component may serve the dual role of being configured to filter or match signals or shunt noise from the electrically-conductive traces and provide an electrical and mechanical connection between the first PCB 202 and the second PCB 204. Further, the electrical connection provided by the decoupling, filtering, or matching component may contribute to forming the interior shielded region between the PCBs 202, 204. In some examples a decoupling, filtering, or matching component may be electrically connected between other conductors of the PCBs 202, 204 including power planes and ground planes.

In some cases, decoupling, filtering, or matching components may be configured to act as a filter. As one example, a decoupling, filtering, or matching component may be configured to act as a low-pass filter. Such a decoupling, filtering, or matching components may be configured to filter any suitable frequency range. In some examples, different decoupling, filtering, or matching components may be configured to filter different frequency ranges depending on the type of connection (e.g., to a trace, ground plane, power plane) and/or other factors. Furthermore, the decoupling, filtering, or matching component may be configured to match the impedance of traces when applicable. In some cases, a decoupling, filtering, or matching components may be configured to act as a ground reference for an electronic component, and shielding may be considered a secondary function. In some cases, a decoupling, filtering, or matching component may be is used as a DC block.

Any suitable type of decoupling, filtering, or matching component may be integrated into the grounding shield 206 and electrically connected between the PCBs 202, 204. For example, a decoupling, filtering, or matching component may include a decoupling capacitor, an inductor, a multi-element filter (e.g., "L," "T," "π" topologies) or another type of filter or signal conditioning component such as a diplexer, circulator, combiner, etc.

The grounding shield 206 may include any suitable combination of different types of commodity surface-mountable electronic components and/or surface-mountable metallic structures 207. In some examples, all of the commodity surface-mountable electronic components and/or surface-mountable metallic structures 207 may be the same type of electronic component (e.g., a zero-ohm resistor). In some examples, different types of electronic components may be positioned according to the surface layouts of the PCBs 202, 204. For example, a zero-ohm resistor may be electrically connected between perimeter ground planes of the PCBs 204, 204 at one portion of the grounding shield 206 and a decoupling, filtering, or matching component may be electrically connected between electrically-conductive traces of the PCBs 202, 204 at another portion of the grounding shield 206. Any suitable type of commodity surface-mountable electronic component and/or surface-mountable metallic structure may be positioned at any suitable portion of the grounding shield 206 depending on the connection type and functionality required the electronic component.

Figure 3A:
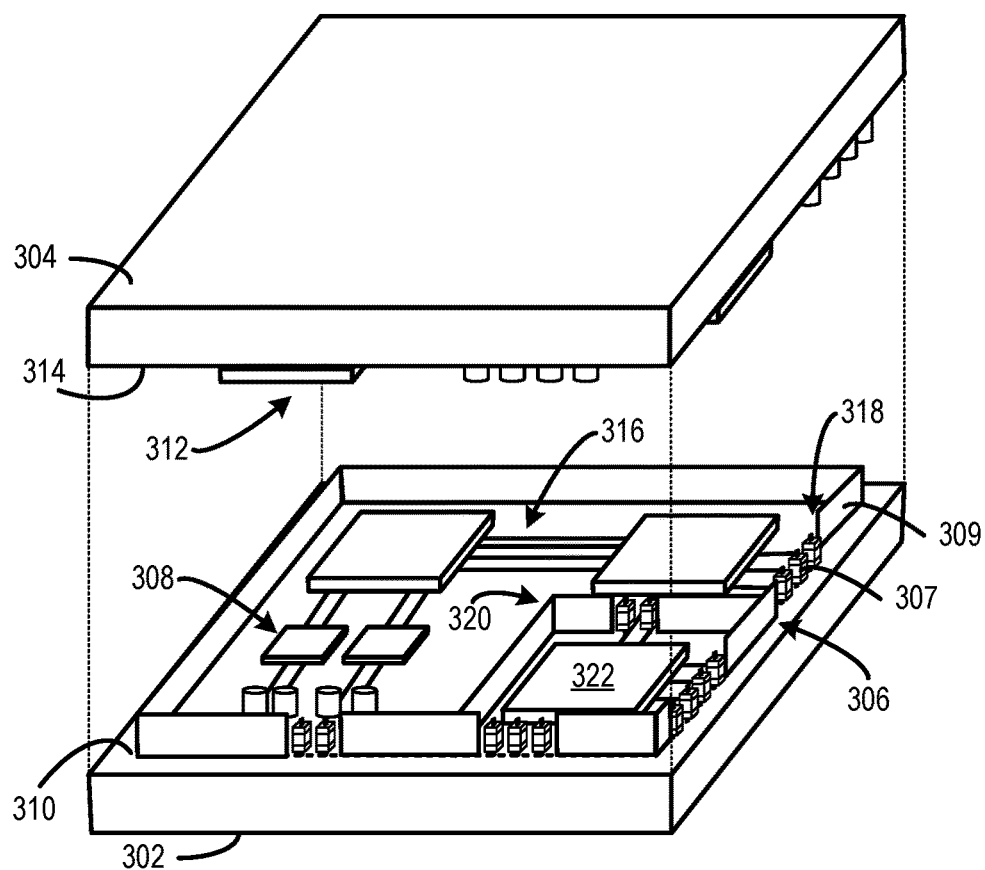
FIGS. 3A and 3B schematically show another example electronic assembly comprising mutually shielding PCBs electrically connected to a common grounding shield including a plurality ground contact points that include surface-mountable electronic components and surface-mountable metallic structures positioned around different portions of a perimeter as well as other grounding structures or materials electrically connecting the two PCBs.
Figure 3B:
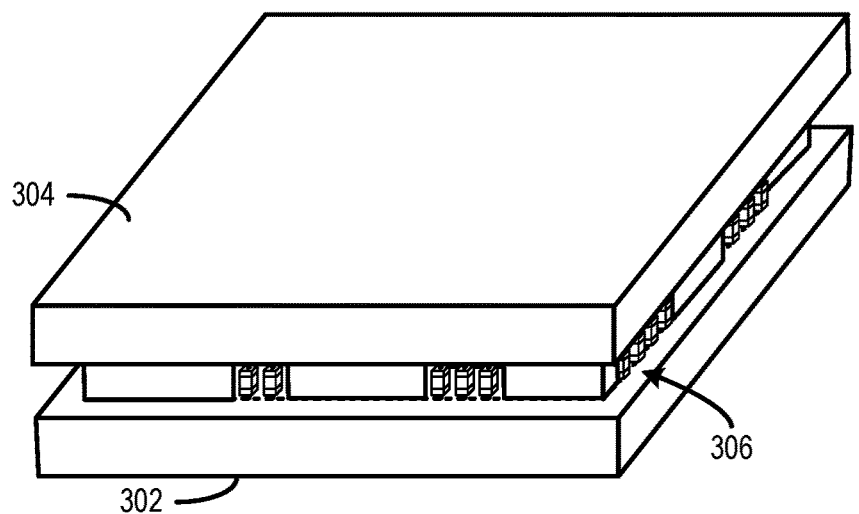

FIGS. 3A and 3B schematically show another example electronic assembly 300 comprising a first PCB 302 and a second PCB 304 electrically connected to a common grounding shield 306 comprising a plurality of commodity surface-mountable electronic components and/or surface-mountable metallic structures 307 and other conductive material 309. FIG. 3A shows the second PCB 304 spaced apart from the first PCB 302 to reveal the grounding shield 306 and a first plurality of electronic components 308 positioned on a surface 310 of the first PCB 302. Further, a second plurality of electronic components 312 are positioned on a second surface 314 of the second PCB 304. A plurality of electrically-conductive traces 316 may extend along the surface 310 of the first PCB 302. The plurality of electrically-conductive traces 316 may be configured to electrically connect the plurality of electronic components 308 to various other electronic components and/or other circuitry (e.g., power, ground) on the first PCB 302. Similarly, the second PCB 304 may include a plurality of electrically-conductive traces (not shown). The first and second PCBs 302 and 304 are arranged in a stack such that the surface 310 opposes the surface 314.

The grounding shield 306 may include a plurality of commodity surface-mountable electronic components and/or surface-mountable metallic structures 307 that may be intelligently positioned around the perimeter to provide specific functionality between specific connections. For example, decoupling, filtering, or matching components may be positioned around the perimeter to align with and electrically connect between electrically-conductive traces of the PCBs 302, 304. As another example, a commodity surface-mountable electronic component and/or surface-mountable metallic structure may be positioned around the perimeter to align with and electrically connect between power planes of the PCBs 302, 304. Another example would be if conductive material 309 was a heat sink, chassis, or structural mechanical component and a plurality of commodity surface-mountable electronic components and/or surface-mountable metallic structures 307 was used to fill in any remaining gaps or voids. Another example would be if conductive material 309 required a large keep-out zone, for example if it was conductive foam, and a plurality of commodity surface-mountable electronic components or surface-mountable metallic structures 307 were placed in areas that didn't have enough space for the keep-out zone. In another example conductive material 309 forms a perimeter and a plurality of commodity surface-mountable electronic components or surface-mountable metallic structures 307 form additional grounding shield elements inside of the perimeter. A commodity surface-mountable electronic component and/or surface-mountable metallic structures 307 may be intelligently positioned at any portion of the grounding shield 306 to provide any suitable functionality.

Furthermore, the other conductive material 309 may be connected between ground planes of the PCBs 302, 304 in portions of the perimeter which may include portions inside of the perimeter where the commodity surface-mountable electronic components 307 are not present in order to provide EMI shielding around substantially the entire perimeter which may include portions inside of the perimeter of the PCBs 302, 304. In some examples, the other conductive material 309 may provide structural rigidity to ensure that the two PCBs 302, 304 remain parallel and/or separated. In some examples, the other conductive material 309 may be non-rigid or flexible. In some such examples, the PCBs and/or the surface-mountable electronic component also may be non-rigid or flexible. The other conductive material 309 may include any suitable type of electrically-conductive material including stamped or drawn metal, conductive foam, conductive elastomer, conductive fabric over foam, conductive non-woven fabric, cast or machined aluminum, or another conductive material. The other conductive material 309 may be electrically connected to the ground planes of the PCBs 302, 304 in any suitable manner. Such examples may include epoxy, welding, friction or mechanical fit (e.g., via metal clips), spring force, and adhesive. There may be multiple layers of different conductive material, for example one such stack-up would be conductive adhesive, conductive foam, conductive adhesive. Many other combinations are possible.

The plurality of commodity surface-mountable electronic components and/or surface-mountable metallic structures 307 may be integrated with the other conductive material 309 in the grounding shield 306 in any suitable manner. In the depicted example, the other conductive material 309 forms a sidewall or perimeter fence have cutouts or slots 318 configured to accommodate the commodity surface-mountable electronic components and/or surface-mountable metallic structures 307. The slot(s) 318 may be sized to minimize a distance between the other conductive material 309 and the commodity surface-mountable electronic components and/or surface-mountable metallic structures 307 in order to maintain the shielding effectiveness of the grounding shield 306 and reduce parasitic inductance. In other words, the commodity surface-mountable electronic components and/or surface-mountable metallic structures 307 may substantially fill the space of the slot to maintain shielding along the sidewall and reduce parasitic inductance. In another example, the commodity surface-mountable electronic components and/or surface-mountable metallic structures 307 may be confined within a multi-layer sidewall of the grounding shield 306.

The electronic assembly 300 may include internal walls or compartments. For example, an internal shield compartment 320 may be formed around integrated circuit 322 to isolate the integrated circuit from the other electronic components on the first PCB 302. The commodity surface-mountable electronic components and/or surface-mountable metallic structures 307 may occupy slots in these internal compartment walls in the same manner as on the outer grounding shield 306 to provide the same function. For example, commodity surface-mountable electronic components and/or surface-mountable metallic structures 324 may be electrically connected to electrically-conductive traces connecting between the integrated circuit 322 and the adjacent integrated circuit that is positioned outside of the internal shield compartment 322. In one example, the commodity surface-mountable electronic components and/or surface-mountable metallic structures 324 may provide decoupling, filter, or matching functionality of the electrically-conductive traces.

FIG. 3B schematically shows the second PCB 304 electrically connected and mechanically affixed to the first PCB 302 via the plurality of commodity surface-mountable electronic components and/or surface-mountable metallic structures 307 and other conductive material 309 of the grounding shield 306. The first and second PCBs 302, 304 may be arranged such that conductive layers—e.g., ground planes (not shown) of the first and second PCBs 302, 304 provide mutual shielding from EMI. Further, the first and second PCBs 302, 304 in cooperation with the plurality of commodity surface-mountable electronic components and/or surface-mountable metallic structures 307 and other conductive material 309 that form the grounding shield 306 may collectively form an interior shielded region that electromagnetically isolates the electronic components 308, 312 and traces 316 positioned therein.

Figure 4:
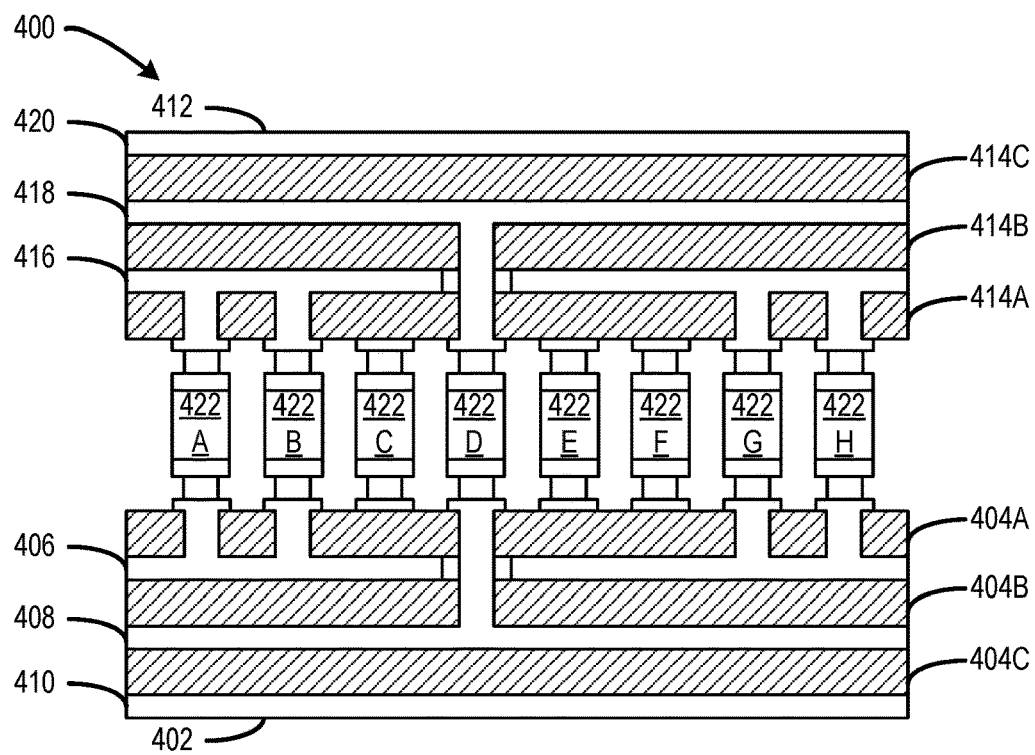
FIG. 4 schematically shows another example electronic assembly including a plurality of surface-mountable electronic components electrically connected between ground planes of two mutually shielding PCBs.
Figure 5:
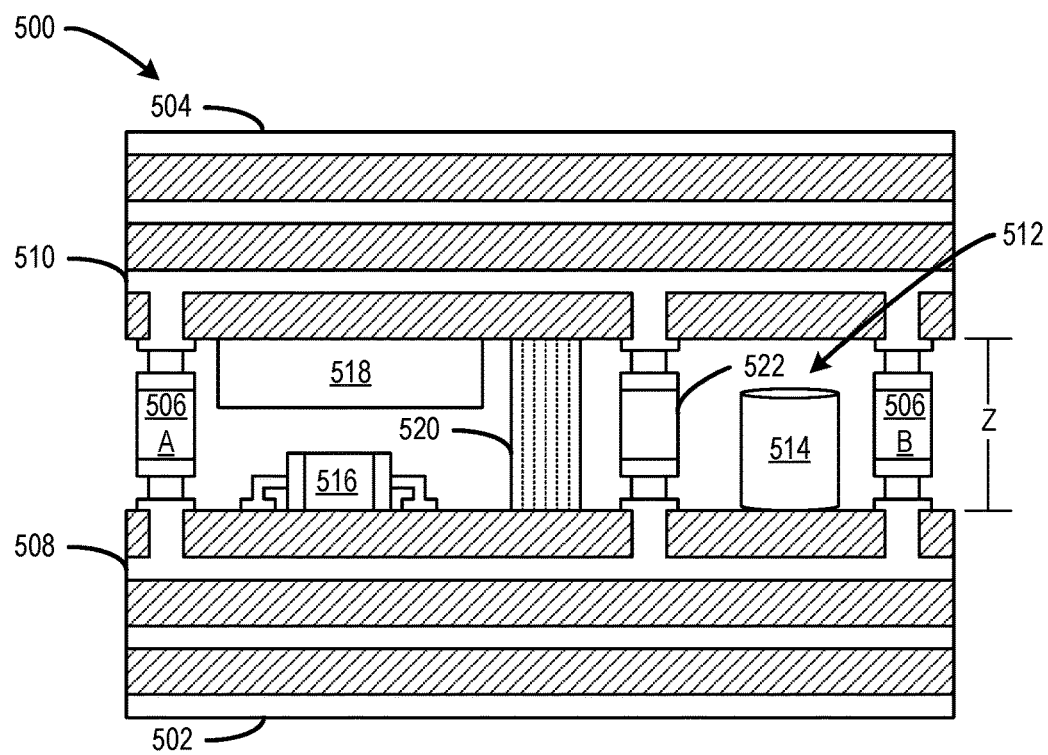
FIG. 5 schematically shows another example electronic assembly including a plurality of surface-mountable electronic components electrically connected between ground planes of two mutually shielding PCBs.

FIGS. 4 and 5 show aspects of different example electronic assemblies having a common grounding shield electrically connected between two mutually shielding PCBs. In particular, these figures show a partial cross-section view of an electronic assembly.

FIG. 4 shows an example electronic assembly 400. The depicted view is a partial cross section taken from the perspective of line A-A in FIG. 2A. However, the line A-A is provided merely as a frame of reference, as the electronic assembly 400 differs from the electronic assembly 200 shown in FIG. 2A. The electronic assembly 400 includes a first PCB 402 including a plurality of substrate layers 404 (e.g., first layer 404A, a second layer 404B, a third layer 404C). A ground plane 406 is positioned between the first layer 404A and the second layer 404B. A power plane 408 is positioned between the second layer 404B and the third layer 404C. An outer conductive layer 410 is positioned below the third layer 404C.

The electronic assembly 400 includes a second PCB 412 that opposes the first PCB 402. The second PCB 412 includes a plurality of substrate layers 414 (e.g., a first layer 414A, a second layer 414B, a third layer 414C). A ground plane 416 is positioned between the first layer 414A and the second layer 414B. A power plane 418 is positioned between the second layer 414B and the third layer 414C. An outer conductive layer 420 is positioned above the third layer 414C.

In the depicted example, a plurality of commodity surface-mountable electronic components and/or surface-mountable metallic structures 422 collectively form a grounding shield electrically connected between the first PCB 402 and the second PCB 412. Within the grounding shield, different commodity surface-mountable electronic components 422 may have different types of connections and provide different functionality. In particular, commodity surface-mountable electronic components and/or surface-mountable metallic structures 422A, 422B, 422G, and 422H each are electrically connected between the ground planes 406 and 416. For example, these components may be zero-ohm resistors. Commodity surface-mountable electronic component and/or surface-mountable metallic structures 422D is electrically connected between the power planes 408 and 418. Commodity surface-mountable electronic components 422B, 422C, 422E, and 422F are decoupling, filtering, or matching components that are electrically connected between different electrically-conductive traces on the surfaces of the first and second PCBs 402, 412. In some implementations, additional decoupling, filtering, or matching components may reside entirely on one PCB, and be connected to any of the decoupling, filtering, or matching components 422B, 422C, 422E, 422F. These additional decoupling, filtering, or matching components can be used to provide performance gains and/or additional capability for filtering or matching applications. For example, a multi-pole lumped element filter can be constructed. Such different electrical connections and functionality provided by the different commodity surface-mountable electronic components 422 may allow for design flexibility, since the PCBs can be electrically connected to each other via any suitable exposed conductor (e.g., copper) on the surface of the PCBs.

Note that the outer conductive layers 410 and 420 may be optionally added to the electronic assembly 400 to provide additional EMI shielding. In such cases, vias are added to complete the shielding enclosure.

FIG. 5 shows an example electronic assembly 500. The depicted view is a partial cross section taken from the perspective of line B-B in FIG. 2A. However, the line B-B is provided merely as a frame of reference, as the electronic assembly 500 differs from the electronic assembly 200 shown in FIG. 2A. The electronic assembly 500 includes a first PCB 502 including a first ground plane 508 and a second PCB 504 including a second ground plane 510. The first PCB 502 opposes the second PCB 504 in a stack such that the ground planes 508 and 510 provide mutual EMI shielding. Commodity surface-mountable electronic components and/or surface-mountable metallic structures 506A and 506B are electrically connected between the ground planes 508 and 510 of the first PCB 502 and the second PCB 504 as part of a grounding shield that cooperates with the mutual shielding PCBs 502 and 504 to form an interior shielded region 512.

The use of commodity surface-mountable electronic components and/or surface-mountable metallic structures to form the grounding shield may reduce a height (Z) of the interior shielded region 512 relative to assemblies where each PCB is separately shield via a "can" style EMI shield. Such reduced height may reduce an overall form factor of the electronic assembly 500. However, due to the restricted height of the interior shield region 512, different electronic components may be intelligently laid out on the surfaces of the two PCBs 502, 504 such that electronic components do not contact or otherwise interfere with each other. For example, a capacitor 514 that has a larger height requirement may be positioned on the first PCB 502 such that no electronic component on the second PCB 504 opposes the capacitor 514. As another example, a surface-mount component 516 that has a smaller height requirement may be positioned on the first PCB 502 and an integrated circuit 518 also having a smaller height requirement may be positioned on the second PCB 504 to oppose the surface-mount component 516 since the two electronic components do not contact or otherwise mechanically interfere with each other.

The interior shielded region 512 may allow for the use of an unshielded electrical connector 520 to electrically connect between the first PCB 502 and the second PCB 504. The unshielded electrical connector 520 may electrically connect between any suitable electronic components, traces, and other connection points on the PCBs 502, 504. The unshielded electrical connector 520 need not have any EMI shielding material or only need a small amount of EMI shielding material since the electrical connector 520 resides in the interior shielded region 512. The lack of EMI shielding material may reduce the cost of the electrical connector 520. In some examples, electrical connector 520 is composed of a plurality of commodity surface-mountable electronic components and/or surface-mountable metallic structures if lower speeds or more electrical current is required. Electrical connector 520 may also be an integrated structure to support high speeds or other requirements.

The interior shielded region 512 may allow for design flexibility of the electronic assembly 500, because different electrical connections between the PCBs 502, 504 may be placed at arbitrary positions within the interior shielded region 512. For example, the unshielded electrical connector 520 may be positioned at any suitable position within the interior shielded region 512. As another example, a commodity surface-mountable electronic component and/or surface-mountable metallic structure 522 may be connected between the ground planes 508 and 510 to provide a ground reference at any suitable position within the interior shielded region 512. In some implementations, a plurality of commodity surface-mountable electronic components and/or surface-mountable metallic structures placed internally in a similar manner as commodity surface-mountable electronic component or surface-mountable metallic structure 522 can be used to create internal shielding cavities that are isolated from each other. Additionally or alternatively, one or more commodity surface-mountable electronic components may be electrically connected between the PCBs 502, 504 at arbitrary locations to serve as interconnects. Generally, the interior shielded region 512 provides the flexibility for various electronic components to be laid out on the surfaces of the PCBs 502, 504 according to any suitable layout design that depends on the purpose of the electronic assembly 500.

Figure 6:
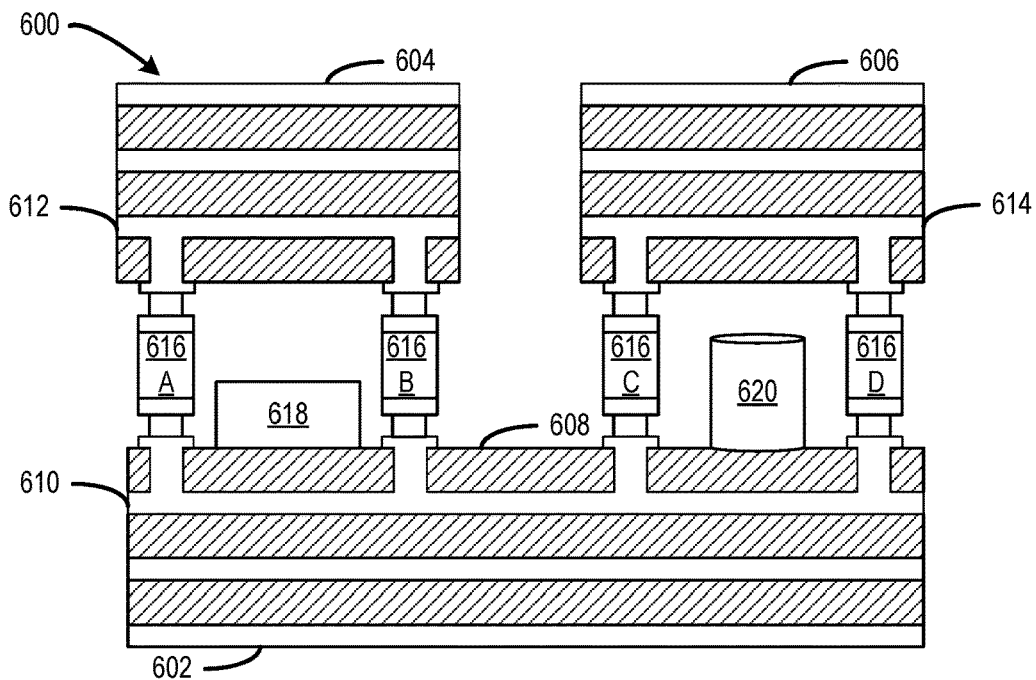
FIG. 6 schematically shows another example electronic assembly where a PCB provides mutually shielding in cooperation with two additional PCBs electrically connected on a same side of the PCB.

FIG. 6 schematically shows another example electronic assembly 600 where a first PCB 602 provides mutual shielding in cooperation with a second PCB 604 and a third PCB 606, which are both electrically connected on a same side/surface 608 of the first PCB 602. The first PCB 602 includes a first ground plane 610. The second PCB includes a second ground plane 612. The third PCB includes a third ground plane 614. The first PCB 602 opposes the second PCB 604 in a stack such that the first and second ground planes 610 and 612 provide mutual EMI shielding. Commodity surface-mountable electronic components and/or surface-mountable metallic structures 616A and 616B are electrically connected between the first and second ground planes 610 and 612 of the first PCB 602 and the second PCB 604 as part of a grounding shield that cooperates with the mutual shielding PCBs 602 and 604 to form an interior shielded region that isolates electronic component 618, which may be an integrated circuit, for example.

Similarly, the first PCB 602 opposes the third PCB 606 in a stack such that the first and third ground planes 610 and 614 provide mutual EMI shielding. Commodity surface-mountable electronic components and/or surface-mountable metallic structures 616C and 616D are electrically connected between the first and third ground planes 610 and 614 of the first PCB 602 and the third PCB 606 as part of a grounding shield that cooperates with the mutual shielding PCBs 602 and 606 to form an interior shielded region that isolates electronic component 612, which may be a capacitor, for example. In the depicted example, the electronic components 618 and 620 may be isolated from each other in different mutually shielded interior regions. In some examples, additional electronic components may be mounted to either of the second PCB 604 or the third PCB 606 within the separate interior shielded regions.

In the depicted scenario, the larger first PCB provides mutual with both the smaller second and third PCB that are affixed to the first PCB.

Figure 7:
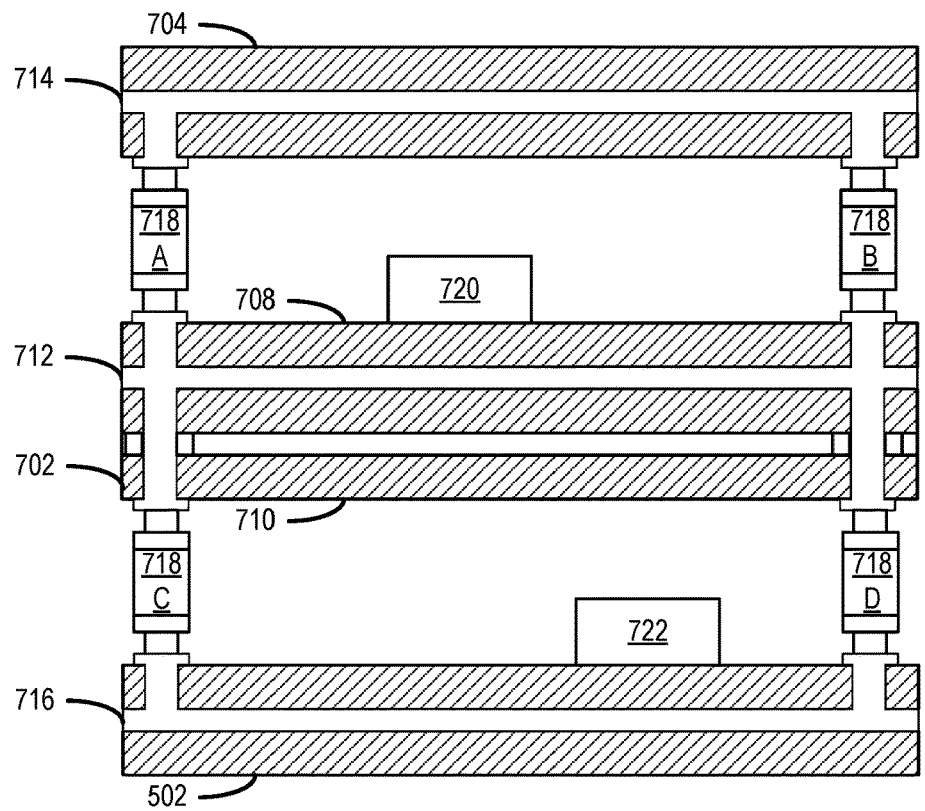
FIG. 7 schematically shows another example electronic assembly where a PCB provides mutually shielding in cooperation with two additional PCBs electrically connected on opposing sides of the PCB.

FIG. 7 schematically shows another example electronic assembly 700 where a first PCB 702 provides mutual shielding in cooperation with a second PCB 704 and a third PCB 706, which are both electrically connected on opposing sides/surfaces of the first PCB 702. In particular, the second PCB 704 is electrically connected to a first side 708 of the first PCB 702. The third PCB 706 is electrically connected to a second side 710 that opposes the first side 708. The first PCB 702 includes a first ground plane 712. The second PCB includes a second ground plane 714. The third PCB includes a third ground plane 716. The first PCB 702 opposes the second PCB 704 in a stack such that the first and second ground planes 712 and 714 provide mutual EMI shielding. Commodity surface-mountable electronic components and/or surface-mountable metallic structures 718A and 718B are electrically connected between the first and second ground planes 712 and 714 of the first PCB 702 and the second PCB 704 as part of a grounding shield that cooperates with the mutual shielding PCBs 702 and 704 to form an interior shielded region that isolates electronic component 720, which may be an integrated circuit, for example.

Similarly, the first PCB 702 opposes the third PCB 706 in the stack such that the first and third ground planes 712 and 716 provide mutual EMI shielding. Commodity surface-mountable electronic components and/or surface-mountable metallic structures 718C and 718D are electrically connected between the first and third ground planes 712 and 716 of the first PCB 702 and the third PCB 706 as part of a grounding shield that cooperates with the mutual shielding PCBs 702 and 706 to form an interior shielded region that isolates electronic component 722, which may be an integrated circuit, for example. In the depicted example, the electronic components 720 and 722 may be isolated from each other in different mutually shielded interior regions. In some examples, additional electronic components may be mounted to any of the first PCB 702, the second PCB 704 or the third PCB 706 within the separate interior shielded regions.

In the depicted example, a plurality of PCBs are stacked such that each PCB mutually shields adjacent PCBs. In some implementations, a larger PCB may have a plurality of smaller mutually shielded PCBs on both its top and bottom surfaces.

It will be appreciated that a PCB may provide mutual shielding in cooperation with any suitable number of additional PCBs. Moreover, the plurality of PCB may have any suitable spatial arrangement relative to each other in order to provide such mutual shielding. In some implementations, a plurality of PCBs may be formed into a geometric shape such that the PCBs mutually shield each other. For example, six PCBs may form the faces of a cube, with an internally shielded region. In such a case, the edges of the PCBs would be mechanically and electrically connected. Commodity surface-mountable electronic components or surface-mountable metallic structures may not be suitable for providing electrical connections between the PCBs in this case, as the PCBs may not be parallel to each other.

Figure 8:
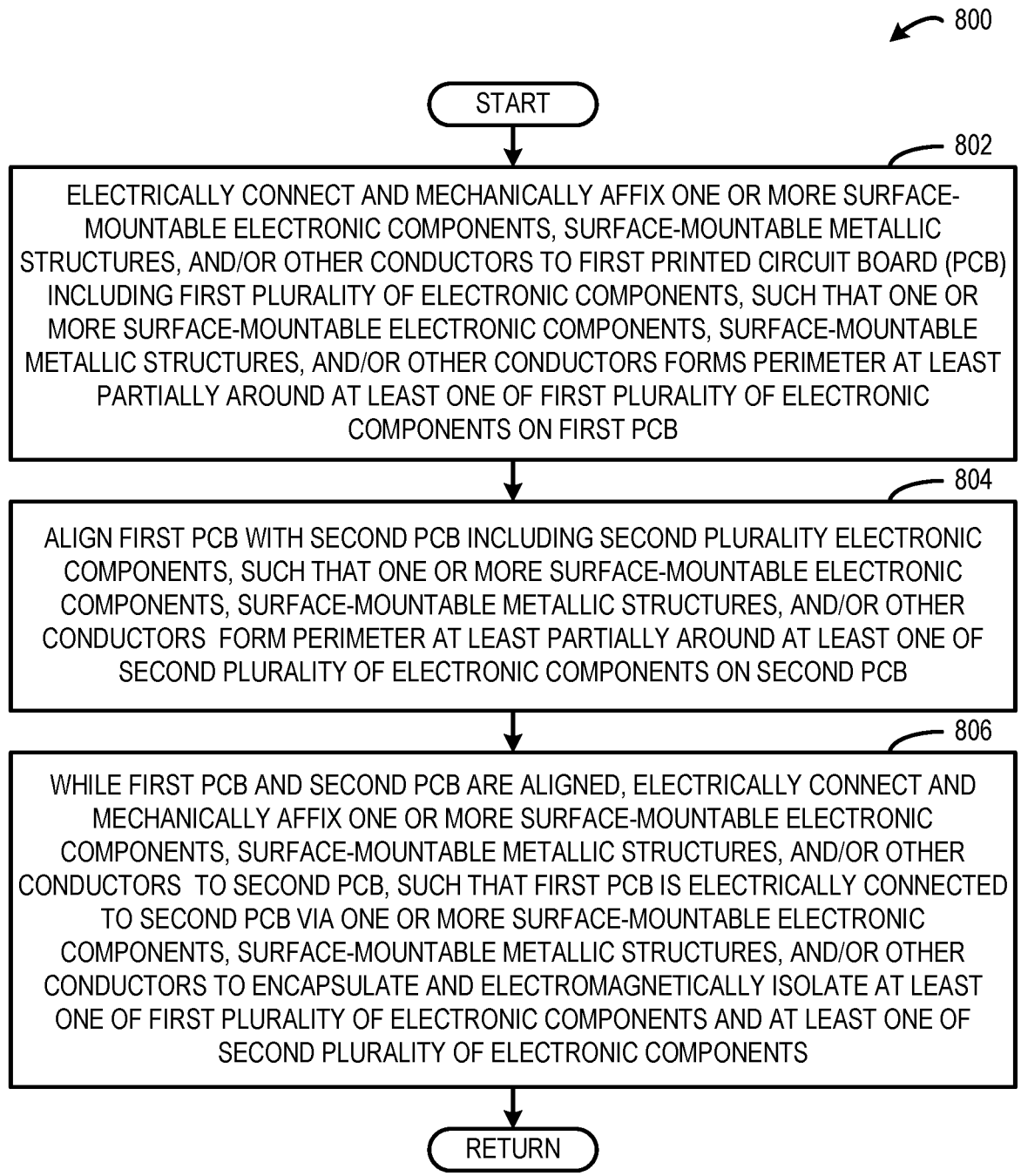
FIG. 8 is a flowchart depicting aspects of an example method for production of an electronic assembly.

FIG. 8 shows aspects of an example method 800 for producing an electronic assembly as described herein. At 802, the method 800 includes electrically connecting and mechanically affixing one or more surface-mountable electronic components, surface-mountable metallic structures, and/or other conductors to a printed circuit board (PCB) including a first plurality of electronic components. The one or more surface-mountable electronic components, surface-mountable metallic structures, and/or other conductors may form a perimeter at least partially around at least one of the first plurality of electronic components on the first PCB. For example, the one or more surface-mountable electronic components, surface-mountable metallic structures, and/or other conductors may be electrically connected and mechanically affixed to a ground plane, a power plane, or an electrically-conductive trace of the first PCB.

In some examples, the plurality of surface-mountable electronic components, surface-mountable metallic structures, or other conductors may form a perimeter around an entirety of the first plurality of electronic components on the first PCB. In some examples, the plurality of surface-mountable electronic components, surface-mountable metallic structures, or other conductors may form a perimeter around an individual electronic component or group of electronic components on the first PCB. In some examples, the plurality of commodity surface-mountable electronic components, surface-mountable metallic structures, or other conductors may form a perimeter around the first PCB as well as internal additional internal shielded regions around one or more electronic components of the first PCB.

In some examples, only the plurality of surface-mountable electronic components may be used to form a ground shield by being electrically connected and mechanically affixed to the first PCB. In some examples, a plurality of surface-mountable electronic components, surface-mountable metallic structures, and other conductors (e.g., stamped or drawn metal, conductive foam, metal-plated plastic or resin) may cooperatively form a ground shield by being electrically connected and mechanically affixed to the first PCB.

In some implementations, the method 800 optionally may include placing a high-temperature solder (or another connection material—e.g., an electrically-conductive epoxy.) on the first PCB, using a pick-and-place machine to place the one or more commodity surface-mountable electronic components vertically such that one end contacts the high-temperature solder (or other connection material), and re-flowing the first PCB and the one or more commodity surface-mountable electronic components and/or surface-mountable metallic structures in an oven to electrically connect and mechanically affix the one or more commodity surface-mountable electronic components and/or surface-mountable metallic structures to the first PCB. In some implementations, the one or more commodity surface-mountable electronic components and/or surface-mountable metallic structures may be electrically connected and mechanically affixed to the first PCB via at least one of mechanical crimping, a spring force, conductive epoxy, or welding.

At 804, the method 800 includes aligning the first PCB with a second PCB including a second plurality of electronic components, such that the one or more surface-mountable electronic components form a perimeter at least partially around at least one of the second plurality of electronic components on the second PCB. In some implementations, this method step optionally may be performed by a pick-and-place machine.

At 806, the method 800 includes while the first PCB and the second PCB are aligned, electrically connecting and mechanically affixing the one or more surface-mountable electronic components, surface-mountable metallic structures, or other conductors to the second PCB, such that the first PCB is electrically connected to the second PCB via the one or more surface-mountable electronic components, surface-mountable metallic structures, or other conductors to encapsulate and electromagnetically isolate the at least one of the first plurality of electronic components and the at least one of the second plurality of electronic components. For example, the one or more surface-mountable electronic components, surface-mountable metallic structures, or other conductors may be electrically connected and mechanically affixed to a ground plane, a power plane, or an electrically-conductive trace of the second PCB.

In some implementations, the one or more commodity surface-mountable electronic components and/or surface-mountable metallic structures may be first soldered to the first PCB via a high-temperature solder. Then, the one or more commodity surface-mountable electronic components and/or surface-mountable metallic structures may be soldered to the second PCB via a reflow solder having a lower melting point than the high-temperature solder. This may allow the entire first PCB and connected commodity surface-mountable electronic components and/or surface-mountable metallic structures assembly to be reflowed in an oven to solder it to the second PCB without the high-temperature solder melting.

In some implementations a plurality of additional smaller PCBs may be added to either side of the first larger PCB following the same process. In some implementations three or more PCBs may be stacked using the same process.

The resulting electronic assembly enables the PCBs to provide mutual EMI shielding in cooperation with the one or more surface-mountable electronic components, surface-mountable metallic structures, or other conductors to encapsulate and electromagnetically isolate at least one of the first plurality of electronic components on the first PCB and at least one of a second plurality of electronic components on a second PCB. In some examples, more than two PCBs are used to form more complex mutually shielded assemblies.

In an example, an electronic assembly comprises a first printed circuit board (PCB) including a first plurality of electronic components and a first conductive layer, a second PCB including a second plurality of electronic components and a second conductive layer, and a grounding shield electrically connected between the first conductive layer of the first PCB and the second conductive layer of the second PCB to electrically connect the first PCB and the second PCB, where the grounding shield at least partially shields at least one of the first plurality of electronic components and/or at least one or the second plurality of electronic components, where the grounding shield comprises at least one surface-mountable electronic component electrically connected between the first conductive layer of the first PCB and the second conductive layer of the second PCB, and where the first PCB and the second PCB are arranged in a stack such that the first conductive layer and the second conductive layer mutually shield at least one of the first plurality of electronic components and at least one of the second plurality of electronic components from electromagnetic interference. In this example and/or other examples, the at least one surface-mountable electronic component may comprise a zero-ohm resistor. In this example and/or other examples, the at least one surface-mountable electronic component may comprise a decoupling, filtering, or matching component. In this example and/or other examples, the decoupling, filtering, or matching component may be one of a shunt capacitor, an inductor, or a multi-element filter. In this example and/or other examples, the at least one surface-mountable electronic component may comprise a non-rigid or flexible surface-mountable electronic component. In this example and/or other examples, at least one of the first plurality of electronic components and/or at least one of the second plurality of electronic components may be thermally connected to the opposite PCB through mechanical contact or a thermal interface material. In this example and/or other examples, the electronic assembly may further comprise a third PCB including a third conductive layer, at least one additional surface-mountable electronic component may be electrically connected between the first conductive layer of the first PCB and the third conductive layer of the third PCB such that the first conductive layer and the third conductive layer provide mutual shielding. In this example and/or other examples, the grounding shield may comprise metal sidewall or fence having at least one slot, at least one surface-mountable electronic component may be positioned in the at least one slot, and the surface-mountable electronic component may be electrically connected between the first PCB and the second PCB. In this example and/or other examples, the grounding shield may extend along substantially an entire first perimeter of the first PCB and an entire second perimeter of the second PCB. In this example and/or other examples, the electronic assembly may further comprise one or more additional surface-mountable electronic components electrically connected between the first PCB and the second PCB at arbitrary locations within a mutually shielded region formed between the first PCB and the second PCB, the one or more additional surface-mountable electronic components may act as interconnects between the first PCB and the second PCB. In this example and/or other examples, the electronic assembly may further comprise an unshielded electrical connector electrically connected between a first electronic component of the first PCB and a second electronic component of the second PCB. In this example and/or other examples, the grounding shield may be electrically connected to the first PCB via a high-temperature solder, and the grounding shield may be electrically connected to the second PCB via a reflow solder having a lower melting point than the high-temperature solder.

In an example, a method of manufacturing an electronic assembly comprises electrically connecting and mechanically affixing one or more surface-mountable electronic components to a printed circuit board (PCB) including a first plurality of electronic components, such that the one or more surface-mountable electronic components forms a perimeter at least partially around at least one of the first plurality of electronic components on the first PCB;

aligning the first PCB with a second PCB including a second plurality of electronic components, such that the one or more surface-mountable electronic components form a perimeter at least partially around at least one of the second plurality of electronic components on the second PCB, and while the first PCB and the second PCB are aligned, electrically connecting and mechanically affixing the one or more surface-mountable electronic components to the second PCB, such that the first PCB is electrically connected to the second PCB via the one or more surface-mountable electronic components to encapsulate and electromagnetically isolate the at least one of the first plurality of electronic components and the at least one of the second plurality of electronic components. In this example and/or other examples, the one or more surface-mountable electronic components may be electrically connected and mechanically affixed to the first PCB using a pick-and-place machine. In this example and/or other examples, the one or more surface-mountable electronic components may be electrically connected and mechanically affixed to the first PCB via a high-temperature solder. In this example and/or other examples, the one or more surface-mountable electronic components may be electrically connected and mechanically affixed to the second PCB via a reflow solder having a lower melting point than the high-temperature solder. In this example and/or other examples, the one or more surface-mountable electronic components may be electrically connected and mechanically affixed to the first PCB and the second PCB via an electrically-conductive epoxy. In this example and/or other examples, the one or more surface-mountable electronic components may be electrically connected and mechanically affixed to the first PCB and the second PCB via at least one of mechanical crimping, a spring force, or welding.

In an example, an electronic assembly comprises a first printed circuit board (PCB) including a first plurality of electronic components and a first conductive layer, a second PCB including a second plurality of electronic components and a second conductive layer, and a grounding shield electrically connected between the first conductive layer of the first PCB and the second conductive layer of the second PCB to electrically connect the first PCB and the second PCB, where the grounding shield is electrically connected to the first PCB via a high-temperature solder, where the grounding shield is electrically connected to the second PCB via a reflow solder having a lower melting point than the high-temperature solder, and where the first PCB and the second PCB are arranged in a stack such that the first conductive layer and the second conductive layer mutually shield at least one of the first plurality of electronic components and at least one of the second plurality of electronic components from electromagnetic interference. In this example and/or other examples, the grounding shield may comprise a plurality of surface-mountable electronic components electrically connected between the first conductive layer of the first PCB and the second conductive layer of the second PCB, the plurality of surface-mountable electronic components may be positioned around substantially an entirety of the first perimeter of the first PCB and the second perimeter of the second PCB to electrically connect the first PCB and the second PCB.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. An electronic assembly, comprising:
a first printed circuit board (PCB) including a first plurality of electronic components mounted on a first surface and a first conductive layer;
a second PCB including a second plurality of electronic components mounted on a second surface and a second conductive layer; and
a grounding shield electrically connected between the first conductive layer of the first PCB and the second conductive layer of the second PCB to electrically connect the first PCB and the second PCB, where the grounding shield at least partially shields at least one of the first plurality of electronic components and/or at least one or the second plurality of electronic components, where the grounding shield comprises a surface-mountable electronic component extending physically between the first surface of the first PCB and the second surface of the second PCB and electrically connected to both of the first conductive layer of the first PCB and the second conductive layer of the second PCB, and where the first PCB and the second PCB are arranged in a stack such that the first surface of the first PCB opposes the second surface of the second PCB and such that the first conductive layer, the second conductive layer and the surface mountable electronic component collectively shield at least one of the first plurality of electronic components and at least one of the second plurality of electronic components from electromagnetic interference.

2. The electronic assembly of claim 1, where the at least one surface-mountable electronic component comprises a zero-ohm resistor.

3. The electronic assembly of claim 1, where the at least one surface-mountable electronic component comprises a decoupling, filtering, or matching component.

4. The electronic assembly of claim 3, where the decoupling, filtering, or matching component is one of a shunt capacitor, an inductor, or a multi-element filter.

5. The electronic assembly of claim 1, where the at least one surface-mountable electronic component comprises a non-rigid or flexible surface-mountable electronic component.

6. The electronic assembly of claim 1, where at least one of the first plurality of electronic components and/or at least one of the second plurality of electronic components is thermally connected to the opposite PCB through mechanical contact or a thermal interface material.

7. The electronic assembly of claim 1, further comprising a third PCB including a third conductive layer, where at least one additional surface-mountable electronic component is electrically connected between the first conductive layer of the first PCB and the third conductive layer of the third PCB such that the first conductive layer and the third conductive layer provide mutual shielding.

8. The electronic assembly of claim 1, where the grounding shield comprises metal sidewall or fence having at least one slot, where at least one surface-mountable electronic component is positioned in the at least one slot, and where the surface-mountable electronic component is electrically connected between the first PCB and the second PCB.

9. The electronic assembly of claim 1, where the grounding shield extends along substantially an entire first perimeter of the first PCB and an entire second perimeter of the second PCB.

10. The electronic assembly of claim 1, further comprising one or more additional surface-mountable electronic components electrically connected between the first PCB and the second PCB at arbitrary locations within a mutually shielded region formed between the first PCB and the second PCB, where the one or more additional surface-mountable electronic components act as interconnects between the first PCB and the second PCB.

11. The electronic assembly of claim 1, further comprising:
an unshielded electrical connector electrically connected between a first electronic component of the first PCB and a second electronic component of the second PCB.

12. The electronic assembly of claim 1, where the grounding shield is electrically connected to the first PCB via a high-temperature solder, and the grounding shield is electrically connected to the second PCB via a reflow solder having a lower melting point than the high-temperature solder.

13. A method of manufacturing an electronic assembly, the method comprising:
electrically connecting and mechanically affixing a surface-mountable electronic component to a first surface of a printed circuit board (PCB) including a first plurality of electronic components on the first surface, such that the surface-mountable electronic component forms a perimeter at least partially around at least one of the first plurality of electronic components on the first PCB;
aligning the first PCB with a second PCB including a second plurality of electronic components mounted on a second surface, such that the surface-mountable electronic component forms a perimeter at least partially around at least one of the second plurality of electronic components on the second PCB; and
while the first PCB and the second PCB are aligned such that first surface opposes the second surface, electrically connecting and mechanically affixing the surface-mountable electronic component to the second surface of the second PCB, such that the surface-mountable electronic component extends physically between the first surface of the first PCB and the second surface of the second PCB and electrically connects to both the first PCB and the second PCB and such that the first PCB is electrically connected to the second PCB via the surface-mountable electronic component to encapsulate and electromagnetically isolate the at least one of the first plurality of electronic components and the at least one of the second plurality of electronic components.

14. The method of claim 13, where the one or more surface-mountable electronic components are electrically connected and mechanically affixed to the first PCB using a pick-and-place machine.

15. The method of claim 13, where the one or more surface-mountable electronic components are electrically connected and mechanically affixed to the first PCB via a high-temperature solder.

16. The method of claim 15, where the one or more surface-mountable electronic components are electrically connected and mechanically affixed to the second PCB via a reflow solder having a lower melting point than the high-temperature solder.

17. The method of claim 13, where the one or more surface-mountable electronic components are electrically connected and mechanically affixed to the first PCB and the second PCB via an electrically-conductive epoxy.

18. The method of claim 13, where the one or more surface-mountable electronic components are electrically connected and mechanically affixed to the first PCB and the second PCB via at least one of mechanical crimping, a spring force, or welding.

19. An electronic assembly, comprising:
a first printed circuit board (PCB) including a first plurality of electronic components mounted on a first surface and a first conductive layer;
a second PCB including a second plurality of electronic components mounted on a second surface and a second conductive layer; and
a grounding shield electrically connected between the first conductive layer of the first PCB and the second conductive layer of the second PCB to electrically connect the first PCB and the second PCB, where the grounding shield is electrically connected to the first PCB via a high-temperature solder, where the grounding shield is electrically connected to the second PCB via a reflow solder having a lower melting point than the high-temperature solder, where the grounding shield comprises a plurality of surface-mountable electronic components, each surface-mountable electronic component extending physically between the first surface of the first PCB and the second surface of the second PCB and electrically connected to both the first conductive layer of the first PCB and the second conductive layer of the second PCB, and where the first PCB and the second PCB are arranged in a stack such that the first surface of the first PCB opposes the second surface of the second PCB and such that the first conductive layer, the second conductive layer and the plurality of surface-mountable electronic components collectively shield at least one of the first plurality of electronic components and at least one of the second plurality of electronic components from electromagnetic interference.

20. The electronic assembly of claim 19, where the plurality of surface-mountable electronic components are positioned around substantially an entirety of the first perimeter of the first PCB and the second perimeter of the second PCB to electrically connect the first PCB and the second PCB.

* * * * *